(12) United States Patent
Hsieh

(10) Patent No.: US 12,125,952 B2
(45) Date of Patent: Oct. 22, 2024

(54) LIGHT EMITTING DIODE PACKAGE STRUCTURE AND METHOD FOR MANUFACTURING THE SAME

(71) Applicant: ISON CORPORATION, Taoyuan (TW)

(72) Inventor: Hsin-Po Hsieh, Taoyuan (TW)

(73) Assignee: ISON CORPORATION, Taoyuan (TW)

( * ) Notice: Subject to any disclaimer, the term of this patent is extended or adjusted under 35 U.S.C. 154(b) by 477 days.

(21) Appl. No.: 17/701,628

(22) Filed: Mar. 22, 2022

(65) Prior Publication Data

US 2022/0328732 A1   Oct. 13, 2022

(30) Foreign Application Priority Data

Apr. 13, 2021   (TW) .................................. 110113195

(51) Int. Cl.
  *H01L 33/50*   (2010.01)
  *H01L 33/00*   (2010.01)
(52) U.S. Cl.
  CPC ........ *H01L 33/505* (2013.01); *H01L 33/0095* (2013.01); *H01L 2933/0041* (2013.01)
(58) Field of Classification Search
  CPC ... H01L 33/505; H01L 33/0095; H01L 33/56; H01L 33/62; H01L 33/54; H01L 33/502; H01L 33/504; H01L 25/0753
  See application file for complete search history.

(56) References Cited

U.S. PATENT DOCUMENTS

| 2005/0151147 A1 | 7/2005 | Izuno |
| 2013/0187178 A1 | 7/2013 | Tischler |

| 2013/0244358 A1 | 9/2013 | Chen et al. |
| 2018/0190880 A1* | 7/2018 | Vampola ................. H01L 33/58 |
| 2022/0090761 A1* | 3/2022 | Zhou ......................... F21K 9/64 |

FOREIGN PATENT DOCUMENTS

| DE | 102014103133 A1 | 9/2015 |
| JP | 201335953 A | 2/2013 |
| TW | 201729436 A | 8/2017 |
| TW | 202023070 A | 6/2020 |
| TW | M616814 U | 9/2021 |

OTHER PUBLICATIONS

European Patent Office, Search Report issued on Sep. 12, 2022 for EP application No. 22164655.7.

* cited by examiner

*Primary Examiner* — Marc Anthony Armand
(74) *Attorney, Agent, or Firm* — Li & Cai Intellectual Property Office

(57) ABSTRACT

A light emitting diode package structure and method for manufacturing the same are provided. The light emitting diode package structure includes a substrate, a light emitting chip, a color converting package, and a transparent package. The color converting package covers all light emitting surfaces of the light emitting chip disposed on the substrate. The color converting package has a plurality of color converting particles mixed therein, and parts of the color converting particles are exposed from at least one of side surfaces of the color converting package. The transparent package does not have any color converting particles mixed therein. The transparent package is connected to each of the side surfaces of the color converting package and covers the color converting particles exposed from any one of the side surfaces.

10 Claims, 16 Drawing Sheets

LIGHT EMITTING DIODE PACKAGE STRUCTURE AND METHOD FOR MANUFACTURING THE SAME

CROSS-REFERENCE TO RELATED PATENT APPLICATION

This application claims the benefit of priority to Taiwan Patent Application No. 110113195, filed on Apr. 13, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting diode package structure and method for manufacturing the same, and more particularly to a light emitting diode package structure and method for manufacturing the same applicable in an environment having a high temperature and a high humidity.

BACKGROUND OF THE DISCLOSURE

A conventional light emitting diode package structure primarily includes a substrate, a light emitting chip, and a package. The light emitting chip is disposed on the substrate, the package has phosphors mixed therein, the package covers the light emitting chip, and the light emitted by the light emitting chip is converted to white light after passing through the package. When the conventional light emitting diode package structure is arranged in an ambient environment having high temperature and high humidity, the phosphors exposed from any side surface of the package are easily affected by the ambient environment, so as to change in property and become black materials, thereby affecting a light emitting effect of the conventional light emitting diode package structure.

SUMMARY OF THE DISCLOSURE

In response to the above-referenced technical inadequacy, the present disclosure provides a light emitting diode package structure and method for manufacturing the same to improve on the above-mentioned issue of a conventional light emitting diode package structure. That is to say, when the conventional light emitting diode package structure is in contact with external liquid or water vapor, a cut surface of a package of the conventional light emitting diode package structure easily has black spots.

In one aspect, the present disclosure provides a method for manufacturing a light emitting diode package structure. The method includes a fixing step, a color converting package structure forming step, a removing step, a transparent package structure forming step, and a cutting step. The fixing step is implemented by separately fixing a plurality of light emitting chips onto a substrate. The color converting package structure forming step is implemented by forming a color converting package structure on the substrate. Each of the light emitting chips has a plurality of light emitting surfaces, and the color converting package structure covers all of the light emitting surfaces of each of the light emitting chips. The color converting package structure has at least one type of color converting particles mixed therein, and a light beam emitted by each of the light emitting chips is white after being converted through the color converting package structure. The removing step is implemented by removing one portion of the color converting package structure, so that the color converting package structure is cut into a plurality of color converting packages, and each of the color converting packages covers at least one of the light emitting chips. Each of the color converting packages has a top surface and four side surfaces, and a plurality of edges of the top surface is connected to the four side surfaces. Each of the side surfaces is a cut surface, and parts of the color converting particles are exposed from at least one of the side surfaces. The transparent package structure forming step is implemented by forming a transparent package structure on the substrate. The transparent package structure is connected to the top surface and each of the side surfaces of each of the color converting packages, and the transparent package structure does not have any color converting particles mixed therein. The cutting step is implemented by cutting the transparent package structure and the substrate to form into a plurality of light emitting diode package structures. Each of the light emitting diode package structures includes one portion of the substrate, at least one of the light emitting chips, one of the color converting packages, and one of a plurality of transparent packages formed by one portion of the transparent package structure, each of the transparent packages covers an outer periphery of the one of the color converting packages connected thereto, and the color converting particles exposed from any one of the side surfaces are covered by one of the transparent packages.

In another aspect, the present disclosure provides a light emitting diode package structure. The light emitting diode package structure includes a substrate, at least one light emitting chip, a color converting package, and a transparent package. The at least one light emitting chip is fixed to the substrate. The color converting package is disposed on the substrate. The color converting package covers all of a plurality of light emitting surfaces of the at least one light emitting chip, the color converting package has at least one type of color converting particles mixed therein, and a light beam emitted by the at least one light emitting chip is white after being converted through the color converting package. The color converting package has a top surface and four side surfaces, and a plurality of edges of the top surface is connected to the four side surfaces. Each of the side surfaces is a cut surface, and parts of the color converting particles are exposed from at least one of the side surfaces. The transparent package is disposed on the substrate. The transparent package does not have any color converting particles mixed therein, the transparent package covers an outer periphery of the color converting package, and the color converting particles exposed from any one of the side surfaces are covered by the transparent package.

Therefore, in the light emitting diode package structure and method for manufacturing the same provided by the present disclosure, by the design of the transparent package, the color converting particles exposed from the color converting package do not easily change in property, especially when the light emitting diode package structure is arranged in an ambient environment having high temperature and high humidity.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
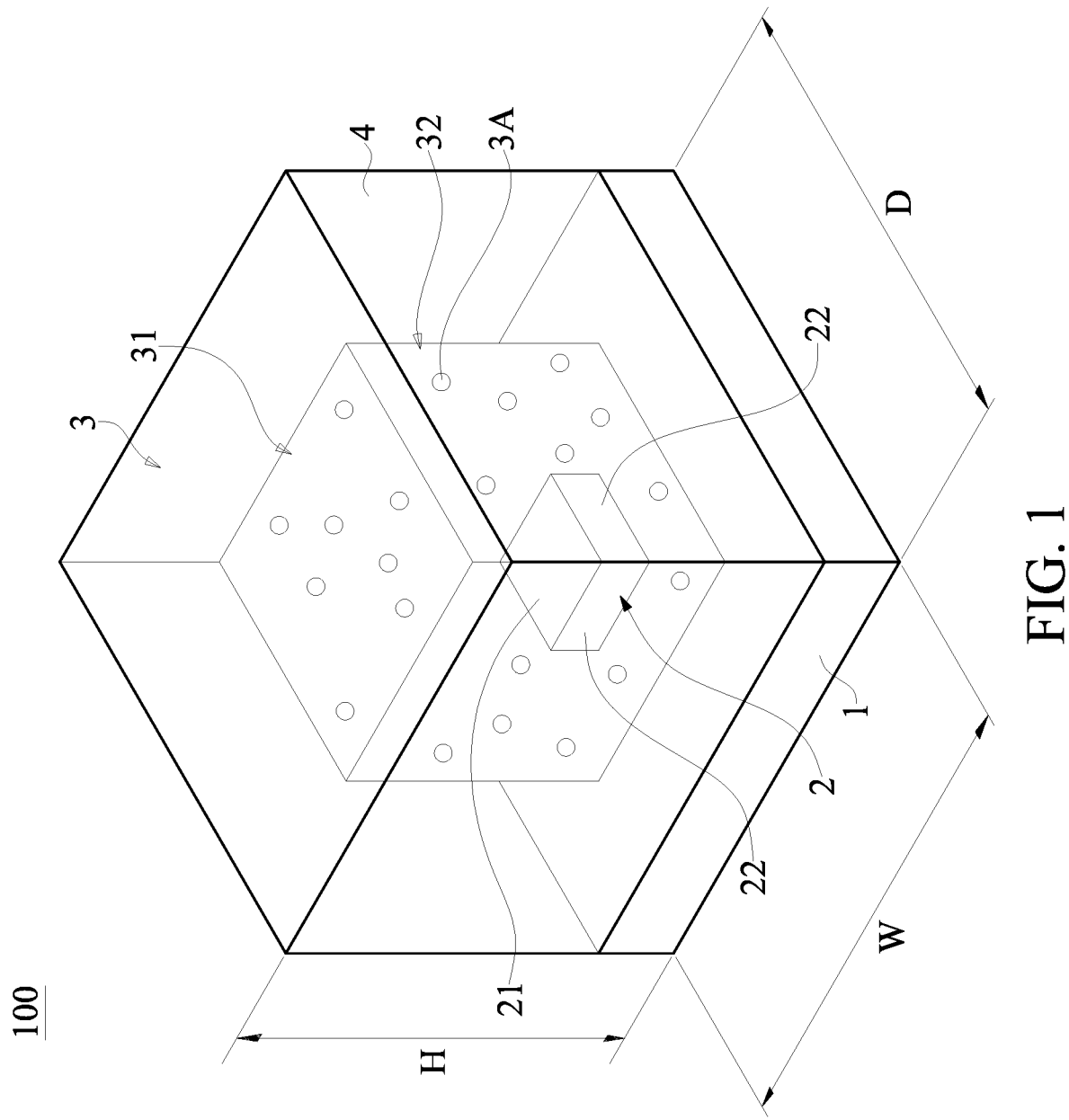
FIG. 1 is a schematic view of a light emitting diode package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
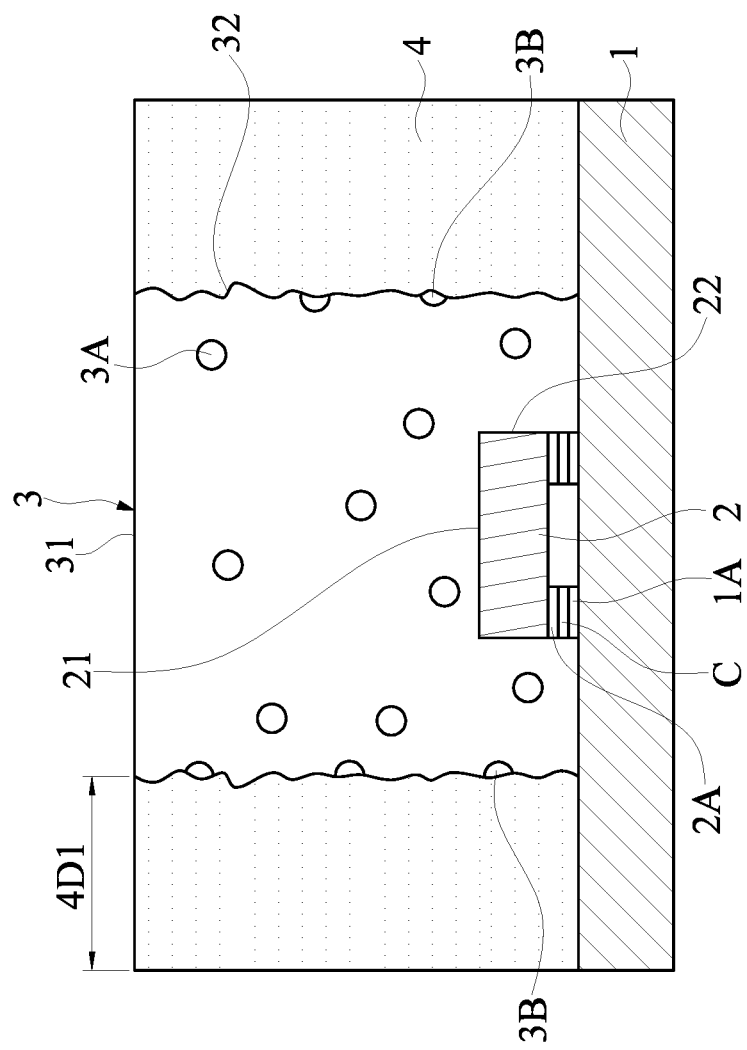
FIG. 2 is a schematic sectional view of the light emitting diode package structure according to the first embodiment of the present disclosure.
Figure 3:
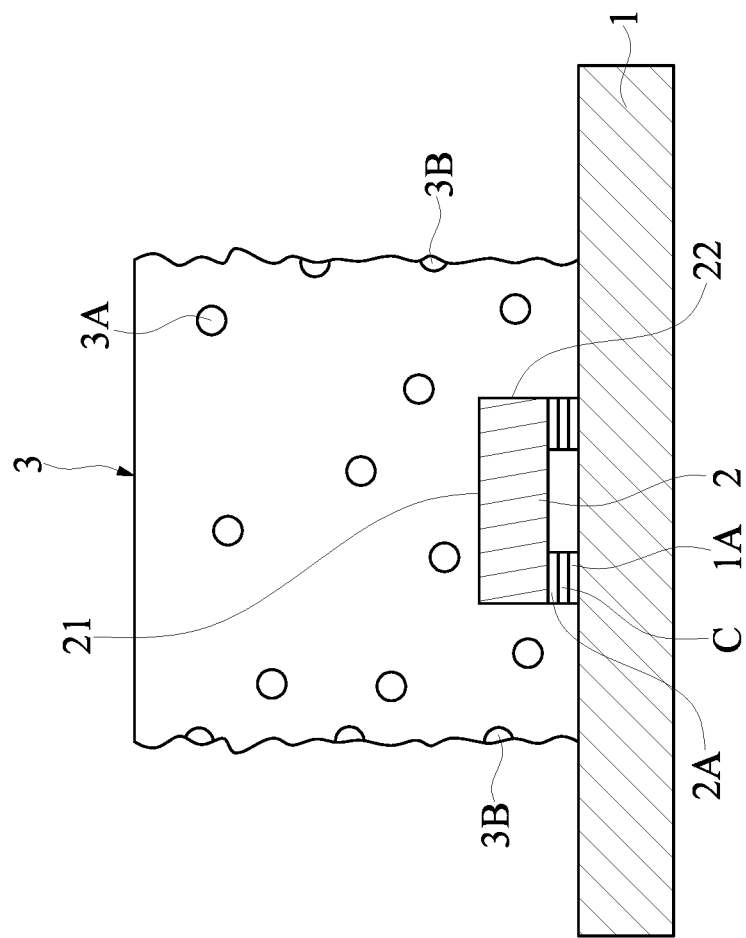
FIG. 3 is a schematic sectional view of a substrate, a light emitting chip, and a color converting package of the light emitting diode package structure according to the first embodiment of the present disclosure.

Referring to FIG. 1 to FIG. 3, FIG. 1 is a schematic view of a light emitting diode package structure according to a first embodiment of the present disclosure, FIG. 2 is a schematic sectional view of the light emitting diode package structure according to the first embodiment of the present disclosure, and FIG. 3 is a schematic sectional view of a substrate, a light emitting chip, and a color converting package of the light emitting diode package structure according to the first embodiment of the present disclosure. A first embodiment of the present disclosure provides a light emitting diode package structure 100 including a substrate 1, a light emitting chip 2, a color converting package 3, and a transparent package 4. The light emitting chip 2 is fixed to the substrate 1. The substrate 1 can be, for example, a bismaleimide triazine resin substrate, a fiberglass substrate (e.g., FR4), a composite substrate (e.g., CEM), a ceramic substrate, or a resin metal composite substrate (e.g., EMC/SMC), but the present disclosure is not limited thereto. In an embodiment of the present disclosure, a height H of the light emitting diode package structure 100 is within a range from 0.3 mm to 0.8 mm, a width W of the light emitting diode package structure 100 is within a range from 0.3 mm to 1.6 mm, and a length D of the light emitting diode package structure 100 is within a range from 0.3 mm to 1.6 mm. More specifically, the light emitting diode package structure 100 of the present disclosure is especially applicable in a mini LED.

The light emitting chip 2 has a top light emitting surface 21 and four side light emitting surfaces 22, and a light beam emitted by the light emitting chip 2 is emitted out of the light emitting chip 2 through the top light emitting surface 21 and the four side light emitting surfaces 22. The light emitting chip 2 can include a plurality of pad structures 2A, the substrate 1 includes a plurality of electrical connection structures 1A, and the pad structures 2A of the light emitting chip 2 are connected to the electrical connection structures 1A through a solder structure C. In other words, the light emitting chip 2 can be fixed to the substrate 1 in a flip-chip manner.

The color converting package 3 is disposed on the substrate 1, and the color converting package 3 covers all of a plurality of light emitting surfaces (i.e., the top light emitting surface 21 and the side light emitting surfaces 22) of the light emitting chip 2. In other words, the light beam emitted by the light emitting chip 2 from the top light emitting surface 21 of any one of the side light emitting surfaces 22 enters into the color converting package 3. The color converting package 3 has at least one type of color converting particles 3A therein, and the light beam emitted by the light emitting chip 2 is white after being converted through the color converting package 3. For example, the light emitting chip 2 can emit a blue light beam, and the color converting package 3 can have green phosphors or red phosphors mixed therein. Or, the light emitting chip 2 can emit a UV light beam, and the color converting package 3 can have green phosphors, red phosphors, and blue phosphors mixed therein.

In a practical application, the type and quantity of the color converting particles 3A mixed in the color converting package 3 can be decided according to the light beam emitted by the light emitting chip 2, but the present disclosure is not limited thereto. The color converting particles 3A can be quantum dots, fluoride phosphors (e.g., KSF), sulfide phosphors, silicate phosphors, aluminate phosphors (e.g., YAG, TAG, LuAG), nitride phosphors, and nitrogen oxide phosphors (e.g., CASON, BSON), but the present disclosure is not limited thereto. For example, a wavelength of the light beam emitted by the light emitting chip 2 can be within a range from 430 nm to 470 nm, and the color converting package 3 can be made of silicone or epoxy having red fluoride phosphors (i.e., KSF) and green nitride phosphors (i.e., β-SiAlON) mixed therein. The light emitting chip can be, for example, a UV LED having a wave length less than 410 nm, and the color converting package 3 can be made of blue phosphate compound phosphors (i.e., SBCA) having red nitrogen oxide phosphors (i.e., CASON) and green nitrogen oxide phosphors (i.e., BSON).

The color converting package 3 has a top surface 31 and four side surfaces 32, and a plurality of edges of the top surface 31 are connected to the four side surfaces 32. Each of the side surfaces 32 is a cut surface, and parts of the color converting particles 3B are exposed from at least one of the side surfaces 32. The "cut surface" mentioned herein refers to a surface of the color converting package 3 cut by a relevant tool (e.g., a dicing saw cutting machine). Basically, since the color converting particles 3A are irregularly dispersed in a material (e.g., silicone or epoxy) forming the color converting package 3, each of the cut surfaces basically has color converting particles 3B exposed from the cut surface. In order to differentiate a cut surface and a non-cut surface, in FIG. 1 to FIG. 3 of the present embodiment, the side surfaces 32 of the color converting package 3 are uneven, and the top surface 31 of the color converting package is even.

The transparent package 4 is disposed on the substrate 1, and the transparent package 4 does not have any color converting particles 3A mixed therein. The transparent package 4 covers an outer periphery of the color converting package 3, and the color converting particles 3B exposed from any one of the side surfaces 32 are covered by the transparent package 4. The transparent package 4 can be, for example, made of a material such as silicone or epoxy. In a preferable embodiment, a refractive index of the transparent package 4 is within a range from 1.3 to 1.6. Preferably, a thickness 4D1 of the transparent package relative to any one of the side surfaces 32 is within a range from 0.05 mm to 0.5 mm.

The transparent package 4 of the present disclosure is primarily configured to cover the color converting particles 3B exposed from the side surfaces 32 of the color converting package 3, so that when the light emitting diode package structure 100 is arranged in the ambient environment having high temperature and high humidity, the color converting particles 3B exposed from each of the side surfaces 32 are not easily affected by the ambient environment, thereby preventing a property change of the color converting particles 3B. For example, when the sulfide phosphors are in contact with water vapor, the sulfide phosphors change in property and become black materials. The color converting particles 3B becoming the black materials cannot provide a color converting function, and a light emitting effect of the light emitting package structure 100 is affected.

According to the above, by the design of the transparent package 4 of the light emitting diode package structure 100 of the present disclosure, the color converting particles 3B exposed from the side surfaces 32 of the color converting package 3 are covered by the transparent package 4, and therefore, even if the light emitting diode package structure 100 is arranged in the ambient environment having high temperature and high humidity, the color converting particles 3B do not easily change in property.

Moreover, a conventional light emitting diode package structure does not have the transparent package of the present disclosure. Therefore, when the conventional light emitting diode package structure is arranged in the ambient environment having high temperature and high humidity, a plurality of color converting particles exposed from cut surfaces are easily oxidized, and accordingly, the conventional light emitting diode package structure has black spots, thereby affecting a light emitting effect of the conventional light emitting diode package structure.

Figure 4:
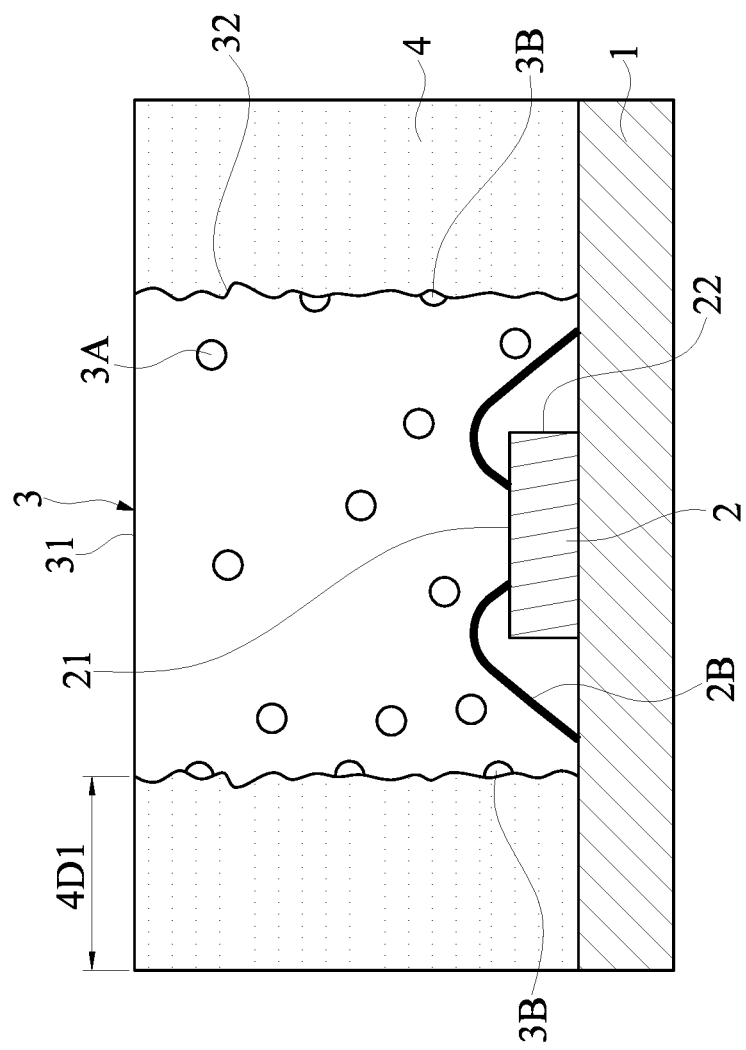
FIG. 4 is a schematic view of the light emitting diode package according to a second embodiment of the present disclosure.

Referring to FIG. 4, FIG. 4 is a schematic view of the light emitting diode package according to a second embodiment of the present disclosure. The difference between the present embodiment and the previous embodiment is that the light emitting chip 2 is electrically connected to the substrate 1 through two conducting wires 2B. In other words, the light emitting chip 2 is fixed to the substrate 1 through wire bonding.

Another difference between the present embodiment and the previous embodiment is as follows. The transparent package 4 and the color converting package 3 are made of different materials, a shore hardness of the transparent package 4 is greater than a shore hardness of the color converting package 3, the shore A hardness (Shore A) of the color converting package 3 can be within a range from 30 to 90 degrees (HA), and the shore D hardness (Shore D) of the transparent package 4 can be within a range 30 to 90 degrees (HD). For example, a major content of the transparent package 4 can be silicone or epoxy, but the present disclosure is not limited thereto. A maximum value of the shore A hardness (Shore A) is 95 degrees, and 95 degrees of shore A hardness (Shore A) are substantially equal to 30 degrees of shore D hardness (Shore D).

Moreover, since the shore A hardness (Shore A) of the color converting package 3 is within the range from 30 to 90 degrees (HA), the shore D hardness (Shore D) of the transparent package 4 is within the range 30 to 90 degrees (HD), and when the light emitting diode package structure 100 is arranged in an ambient environment having an enormous temperature change, the two conducting wires 2B do not easily crack due to thermal expansion of the color converting package 3. In addition, since the hardness of the transparent package 4 is greater than the hardness of the color converting package 3, external water vapor or liquid can be effectively prevented from being in contact with the color converting particles 3B exposed from the side surfaces 32 of the color converting package 3.

Figure 5:
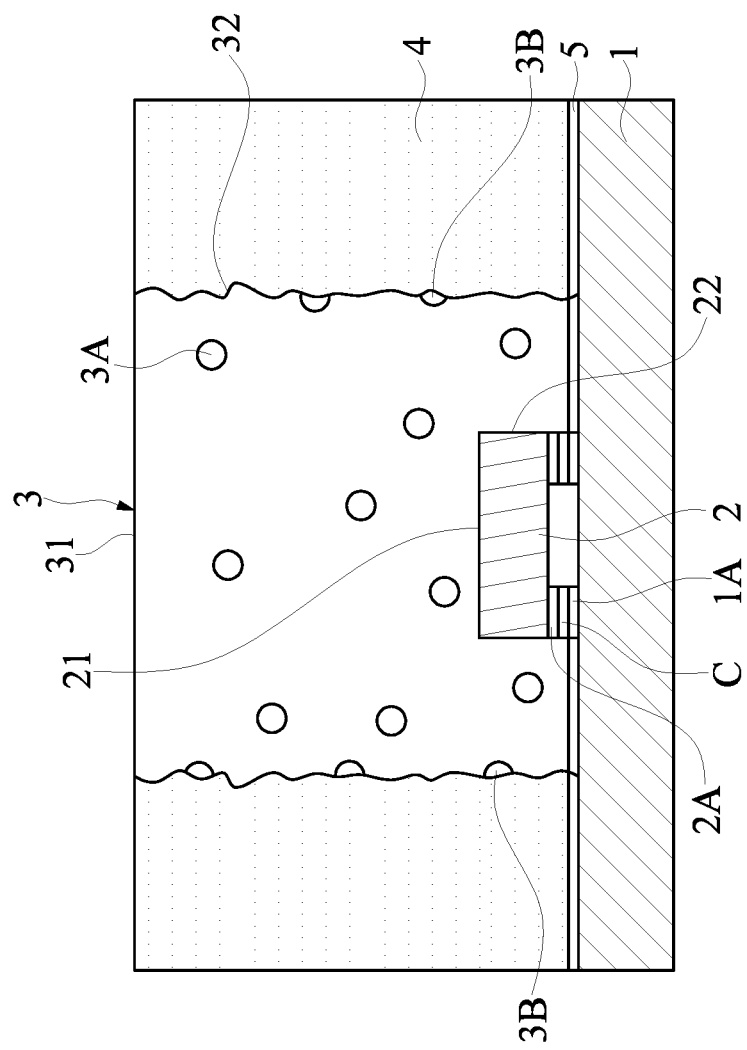
FIG. 5 is a schematic view of the light emitting diode package according to a third embodiment of the present disclosure.
Figure 8:
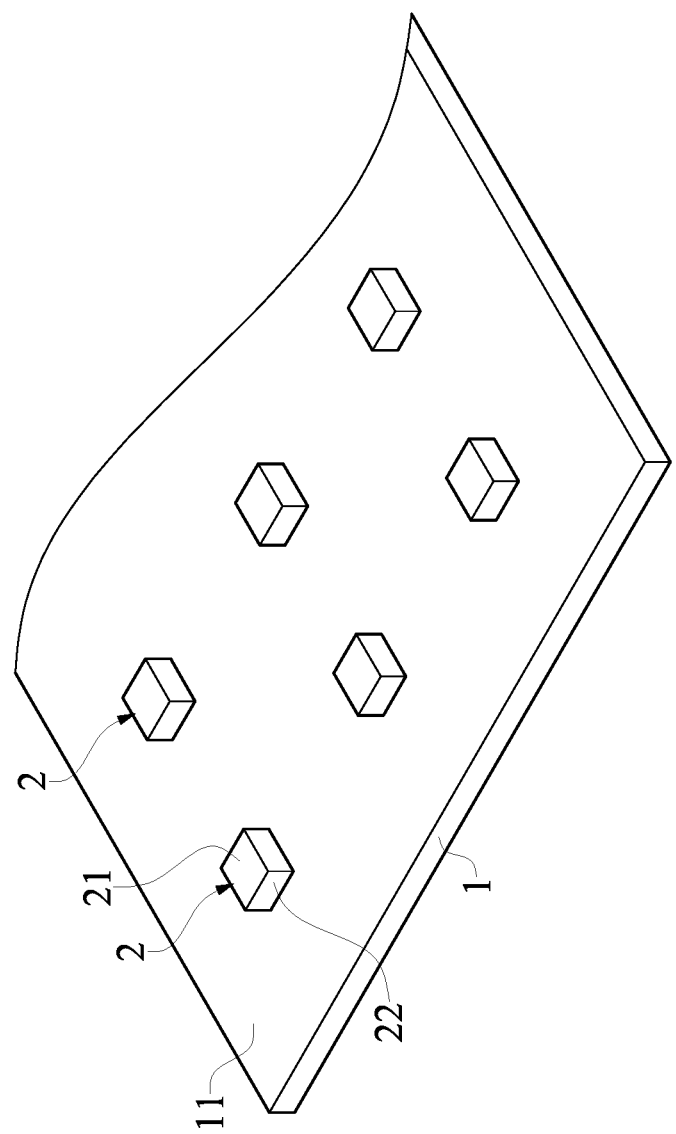
FIG. 8 to FIG. 11 are flow charts of the method for producing the light emitting diode package structure according to the first embodiment of the present disclosure.

Referring to FIG. 5, FIG. 5 is a schematic view of the light emitting diode package according to a third embodiment of the present disclosure. The difference between the present embodiment and the previous embodiment is that a reflective structure 5 is disposed on a top surface 11 (as shown in FIG. 8) of the substrate 1, and the light emitting chip 2 is disposed on the top surface 11. The reflective structure 5 is configured to reflect the light beam emitted by the light emitting chip 2. Through the reflective structure 5, the light beam emitted by the light emitting chip 2 can be effectively utilized.

Figure 6:
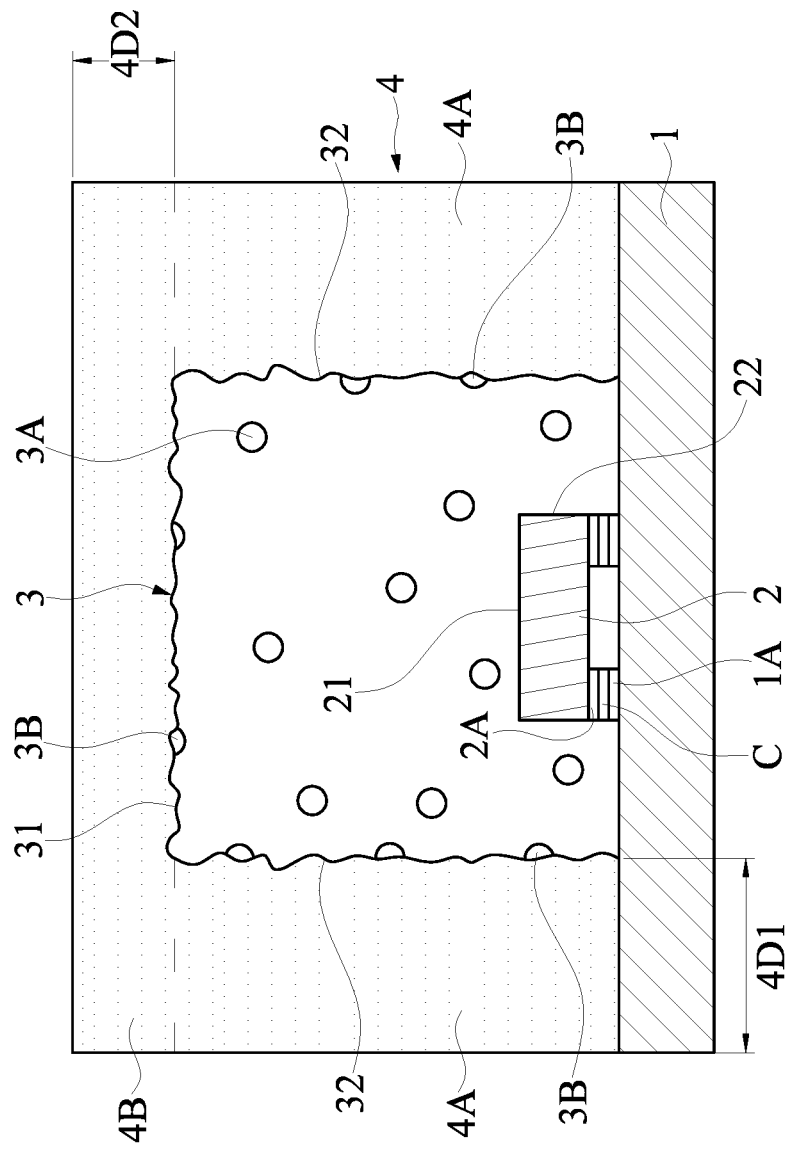
FIG. 6 is a schematic view of the light emitting diode package according to a fourth embodiment of the present disclosure.
Figure 7:
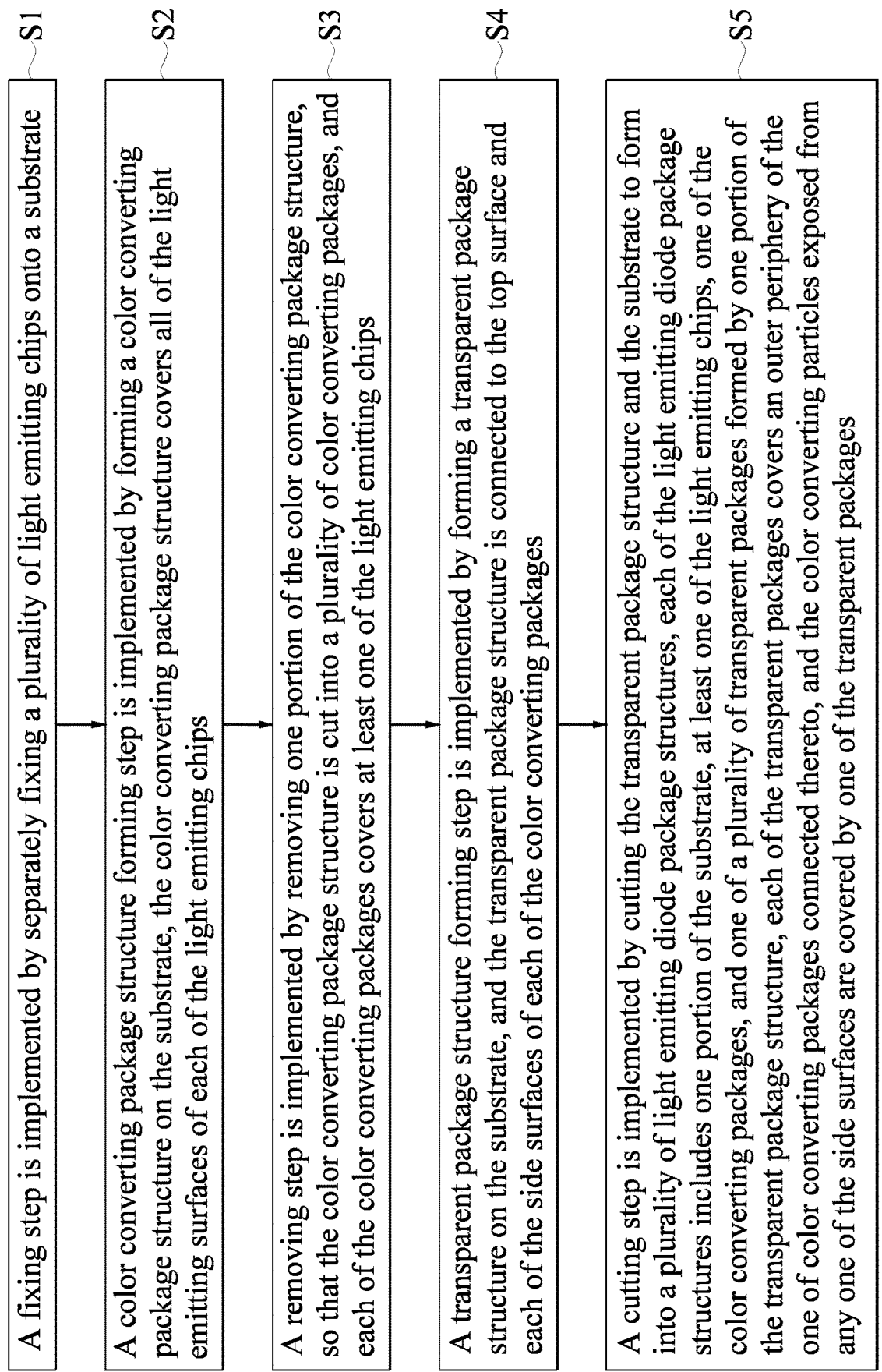
FIG. 7 is a flowchart of a method for producing a light emitting diode package structure according to the first embodiment of the present disclosure.

Referring to FIG. 6, FIG. 6 is a schematic view of the light emitting diode package according to a fourth embodiment of the present disclosure. The difference between the present embodiment and the previous embodiment is that the color converting package 3 has at least one polishing mark structure at the top surface 31 thereof, and parts of the color converting particles 3B are exposed from the top surface 31. The "polishing mark structure" mentioned herein refers to a mark remained after utilizing a relevant tool to perform a polishing operation to the top surface 31 of the color converting package 3 in a process for manufacturing the color converting package 3. As shown in FIG. 6 of the present embodiment, the uneven shape on the top surface 31 of the color converting package 3 represents that the top surface 31 has the polishing mark structure.

Another difference between the present embodiment and the previous embodiment is as follows. The transparent package 4 has four side portions 4A and a top portion 4B, the four side portions 4A are connected to the four side surfaces 32 of the color converting package 3, the top portion 4B is connected to the top surface 31, and the color converting particles 3B exposed from the top surface 31 are covered by the top portion 4B. The four side portions 4A and the top portion 4B are in a one-piece structure. In a practical application, a thickness 4D1 of the side portion 4A can be within a range from 0.05 mm to 0.5 mm, and a thickness 4D2 of the top portion 4B can be within a range from 0.05 mm to 0.5 mm.

According to the above, by the design of the top portion 4B of the transparent package 4, the color converting particles 3B exposed from the top surface 31 of the color converting package 3 are not directly exposed out of the light emitting diode package structure 100. In addition, even if the light emitting diode package structure 100 is arranged in the ambient environment having high temperature and high humidity, the color converting particles 3B exposed from the top surface 31 of the color converting package 3 do not easily change in property since the color converting particles 4 are covered by the transparent package 4.

It is worth mentioning that in other embodiments, if the top surface 31 of the color converting package 3 is the cut surface (the definition of the cut surface can be referred to in the previous embodiment, and will not be reiterated herein), the transparent package 4 still covers the whole color converting package 3, and the top portion 4B of the transparent package 4 correspondingly covers the color converting particles 3B exposed from the top surface 31.

Therefore, through the transparent package 4 of the light emitting diode package structure 100 of the present disclosure, the color converting particles 3B exposed from the side surfaces 32 or the top surface 31 of the color converting package 3 can be effectively covered. Accordingly, when the light emitting diode package structure 100 is arranged in the ambient environment having high temperature or high humidity, the color converting particles 3B exposed from the side surfaces 32 or the top surface 31 do not change in property, and the color converting particles 3B do not form black spots.

Referring to FIG. 7 to FIG. 12, the method for manufacturing the light emitting diode package structure of the present disclosure includes the following steps.

A fixing step S1 is implemented by separately fixing a plurality of light emitting chips 2 onto a substrate 1 (as shown in FIG. 8).

Figure 9:
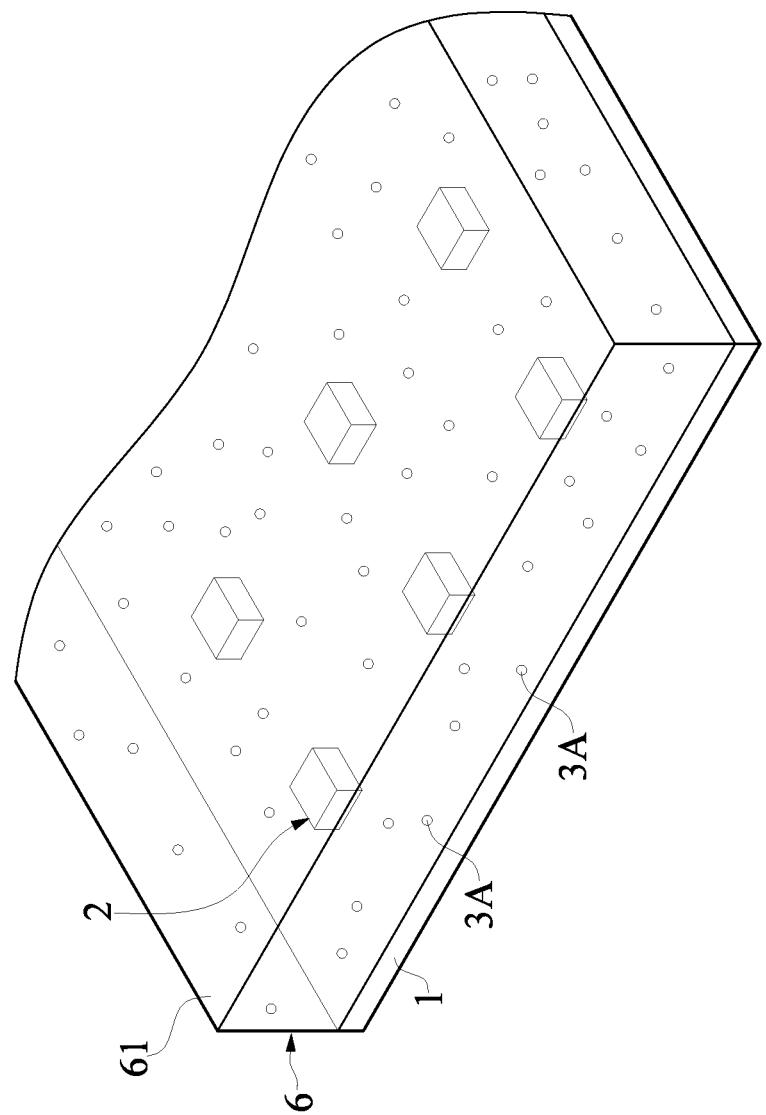

A color converting package structure forming step S2 is implemented by forming a color converting package structure 6 (as shown in FIG. 9) on the substrate 1. The color converting package structure 6 covers all of the light emitting surfaces of each of the light emitting chips 2, the color converting package structure 6 has at least one type of color converting particles 3A mixed therein, and a light beam emitted by each of the light emitting chips 2 is white after being converted through the color converting package structure 6.

Figure 10:
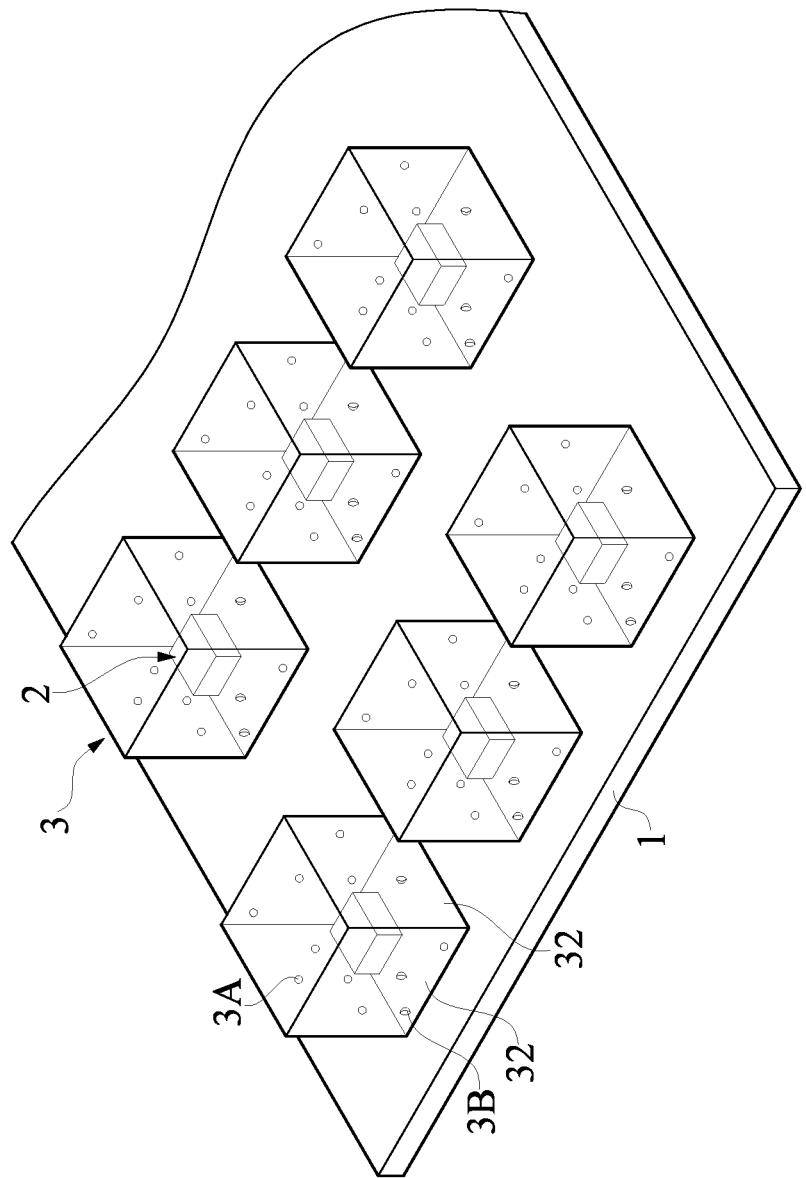
Figure 11:
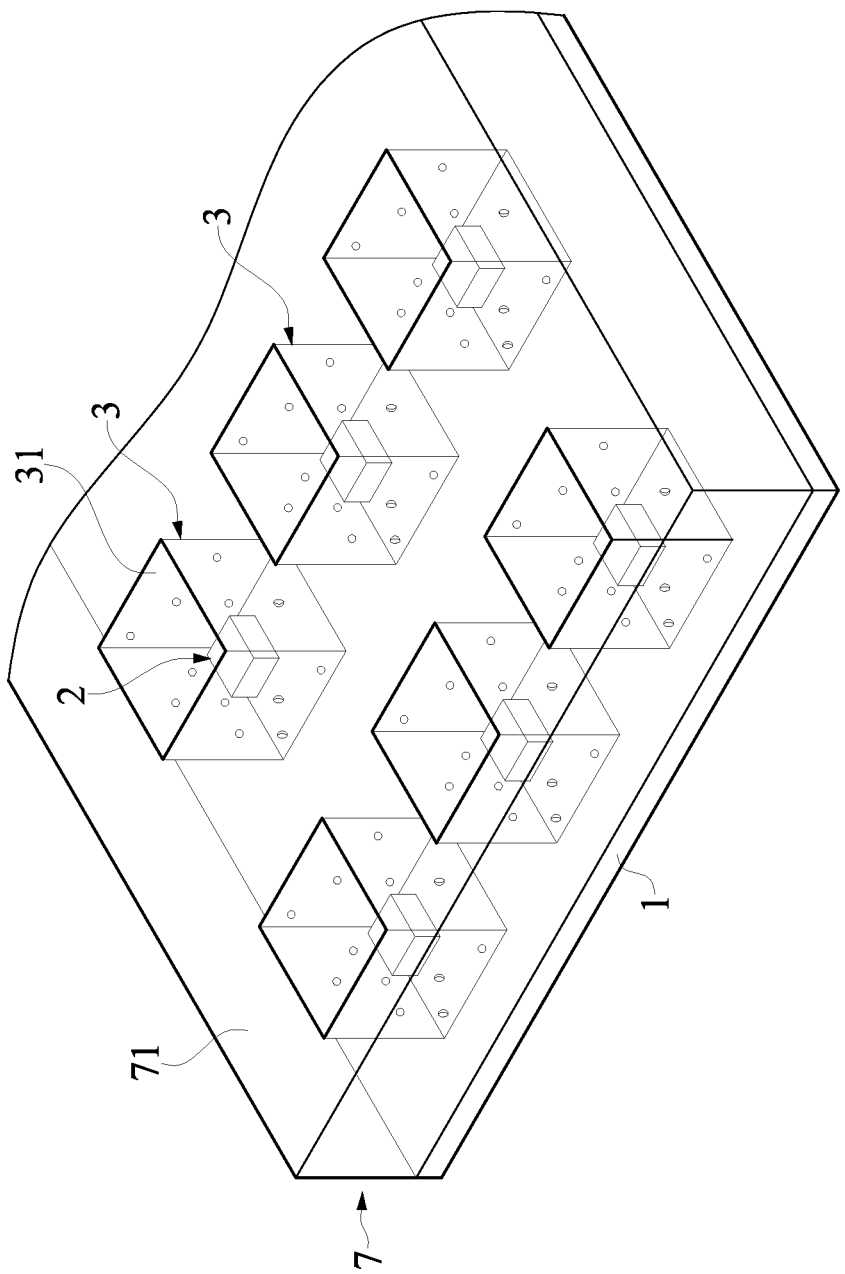
Figure 12:
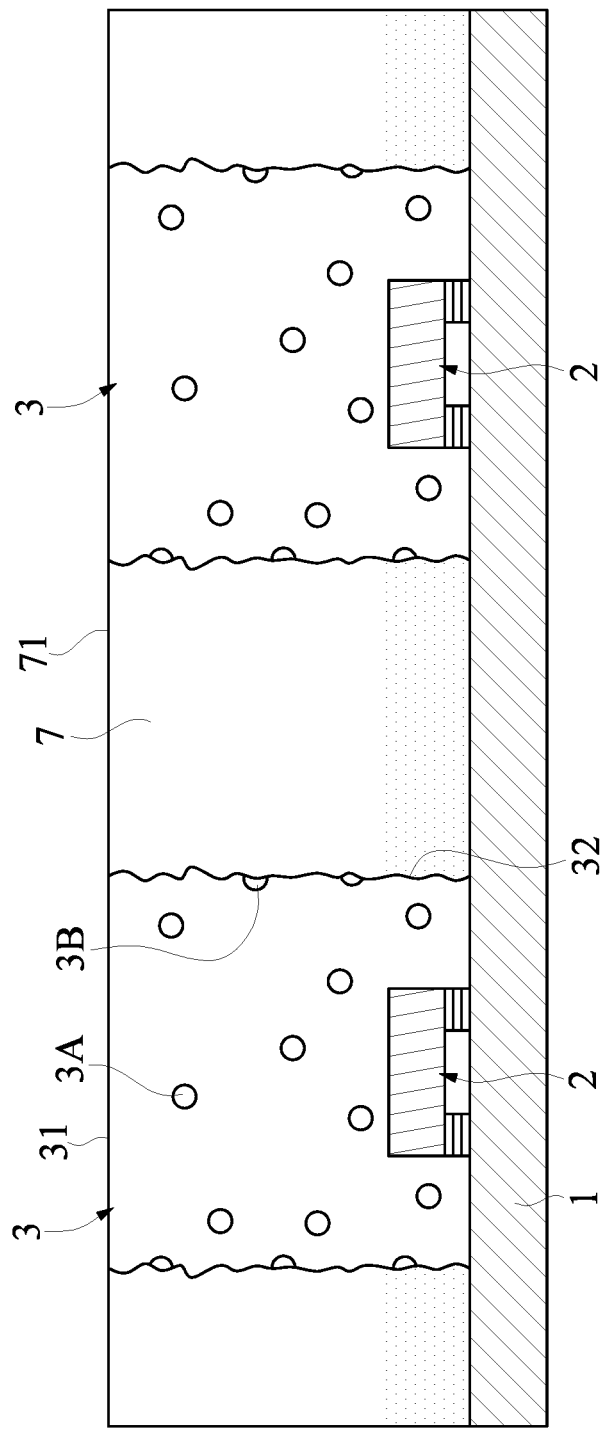
FIG. 12 is a schematic partial sectional view of a component manufactured before a cutting step of the method for producing the light emitting diode package structure according to the first embodiment of the present disclosure.

A removing step S3 is implemented by removing one portion of the color converting package structure 6, so that the color converting package structure 6 is cut into a plurality of color converting packages 3, and each of the color converting packages 3 covers at least one of the light emitting chips 2. Each of the color converting packages 3 has a top surface 31 and four side surfaces 32, a plurality of edges of the top surface 31 is connected to the four side surfaces 32 (as shown in FIG. 10), each of the side surfaces 32 is a cut surface, and parts of the color converting particles 3B are exposed from at least one of the side surfaces 32.

A transparent package structure forming step S4 is implemented by forming a transparent package structure 7 on the substrate 1. The transparent package structure 7 is connected to the top surface 31 and each of the side surfaces 32 of each of the color converting packages 3, and the transparent package structure 7 does not have any color converting particles 3A mixed therein. A top surface 71 of the transparent package 7 is substantially flush with the top surface 31 of each of the transparent packages 3.

A cutting step S5 is implemented by cutting the transparent package structure 7 and the substrate 1 to form into a plurality of light emitting diode package structures 100 (as shown in FIG. 1), each of the light emitting diode package structures 100 includes one portion of the substrate 1, at least one of the light emitting chips 2, one of the color converting packages 3, and one of a plurality of transparent packages 4 formed by one portion of the transparent package structure 7, each of the transparent packages 4 covers an outer periphery of the one of the color converting packages 3 connected thereto, and the color converting particles 3B exposed from any one of the side surfaces 32 are covered by one of the transparent packages 4.

In the fixing step S1 of a practical embodiment of the present disclosure, the light emitting chips 2 are fixed to the substrate 1 in a flip-chip manner, the color converting packages 3 are formed by a material having the plurality of color converting particles 3A mixed in the material, a shore D hardness (Shore D) of the material is within a range from 30 degrees to 90 degrees (HD), and the transparent packages 4 are formed by the material that does not have the plurality of color converting particles 3A mixed in the material. In other words, the color converting package 3 and the transparent package 4 are made of the same material, the major difference between the color converting package 3 and the transparent package 4 is whether the color converting particles 3A are mixed therein.

In the fixing step S1 of another practical embodiment of the present disclosure, the light emitting chips 2 are fixed to the substrate 1 through wire bonding, a shore A hardness of each of the color converting packages 3A (Shore A) is within a range from 30 degrees to 90 degrees (HA), and a shore D hardness (Shore D) of the transparent packages 4 is within a range from 30 degrees to 90 degrees (HD), and the shore hardness of each of the color converting packages 3 is greater than the shore hardness of any one of the transparent packages 4. For example, the color converting packages 3 can be made of silicone having the color converting particles 3A mixed therein, and the transparent package 4 can be made of silicone or epoxy.

In a practical application, in the color converting package structure forming step S2, a mold is utilized to form the color converting package structure 6, and a top surface 61 of the color converting package structure 6 is flat, but the formation manner of the color converting package 6 is not limited thereto.

Figure 13:
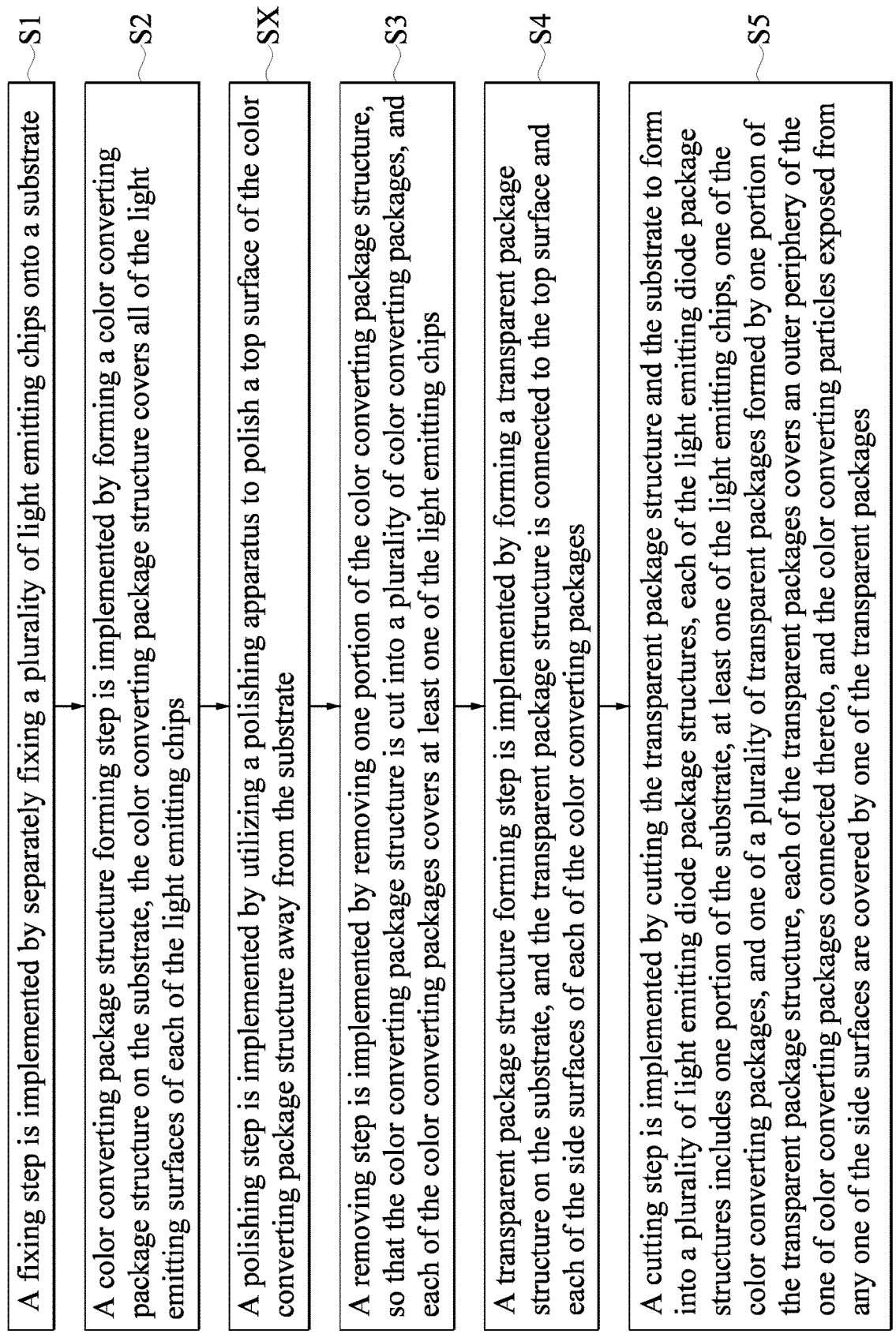
FIG. 13 is a flowchart of the method for producing the light emitting diode package structure according to the second embodiment of the present disclosure.
Figure 14:
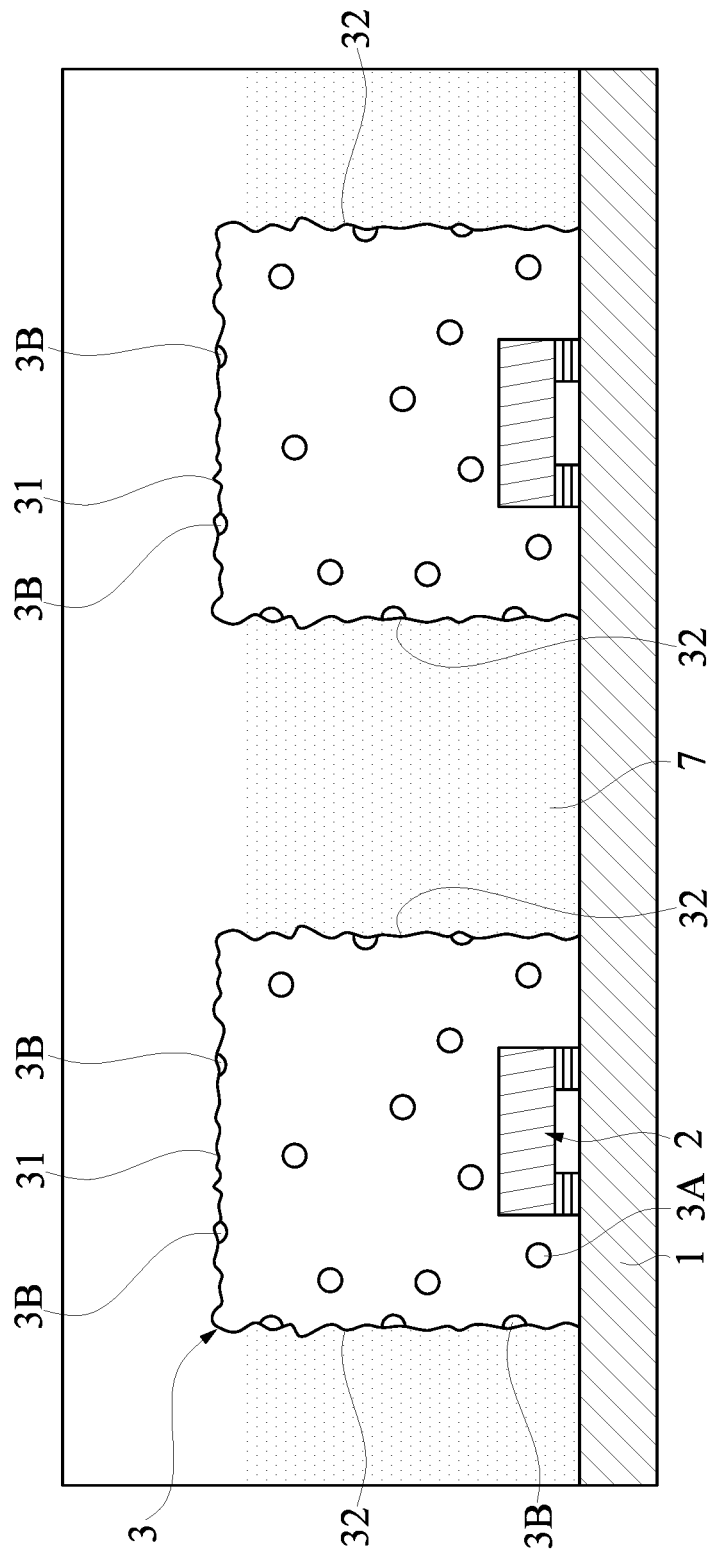
FIG. 14 is a schematic partial sectional view of a component manufactured before the cutting step of the method for manufacturing the light emitting diode package structure according to the second embodiment of the present disclosure.
Figure 15:
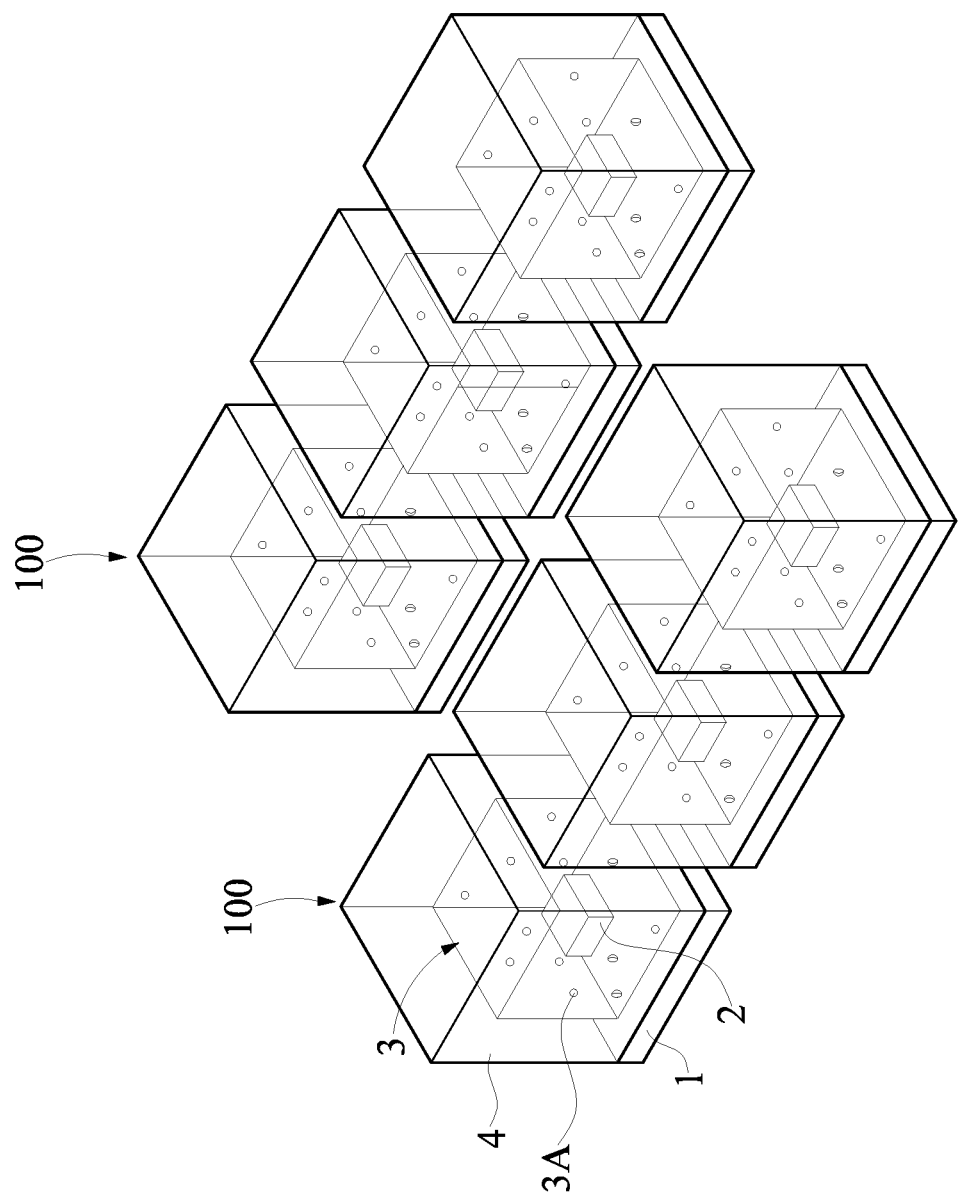
FIG. 15 is a schematic view of the light emitting diode package structures manufactured by the method for manufacturing the light emitting diode package structure according to the second embodiment of the present disclosure.

Referring to FIG. 13 to FIG. 15, the difference between the method for manufacturing the light emitting diode package structure of the present embodiment and that of the previous embodiment is as follows.

The method for manufacturing the light emitting diode package structure of the present embodiment further includes a polishing step SX between the color converting package structure forming step S2 and the removing step S3. The polishing step SX is implemented by utilizing a polishing apparatus to polish a top surface 61 (as shown in FIG. 9) of the color converting package structure 6 away from the substrate 1. In the transparent package structure forming step S4, the transparent package structure 7 covers each of the color converting packages 3, and the color converting particles 3B exposed from a top surface 31 of the corresponding one of the color converting packages 3 are covered by the transparent package structure 7. The transparent package 4 of each of the light emitting diode package structures 100 formed after the cutting step S5 covers the top surface 31 and each of the side surfaces 32 of one of the color converting packages 3 connected to the transparent package 7.

Further, in the color converting package structure forming step S2, if the top surface 61 of the color converting package structure 6 away from the substrate 1 is not flat, or the top surface 61 of the color converting package 6 away from the substrate 1 is required to be flatter, the polishing step SX can be added between the color converting package structure forming step S2 and the removing step S3.

It should be noted that when utilizing the polishing apparatus to perform the polishing operation to the top surface 61 of the color converting package 6, it is unavoidable that parts of the color converting particles 3B included by the color converting package structure 6 are exposed. Therefore, besides the polishing step SX, in the transparent package structure forming step S4 of the present embodiment, the transparent package structure 7 covers each of the color converting packages 3, and accordingly, even the finally-produced light emitting diode package structure 100 is arranged in the ambient environment having high temperature and high humidity, the color converting particles 3B exposed from the top surface 31 of the color converting packages do not easily change in property.

Figure 16:
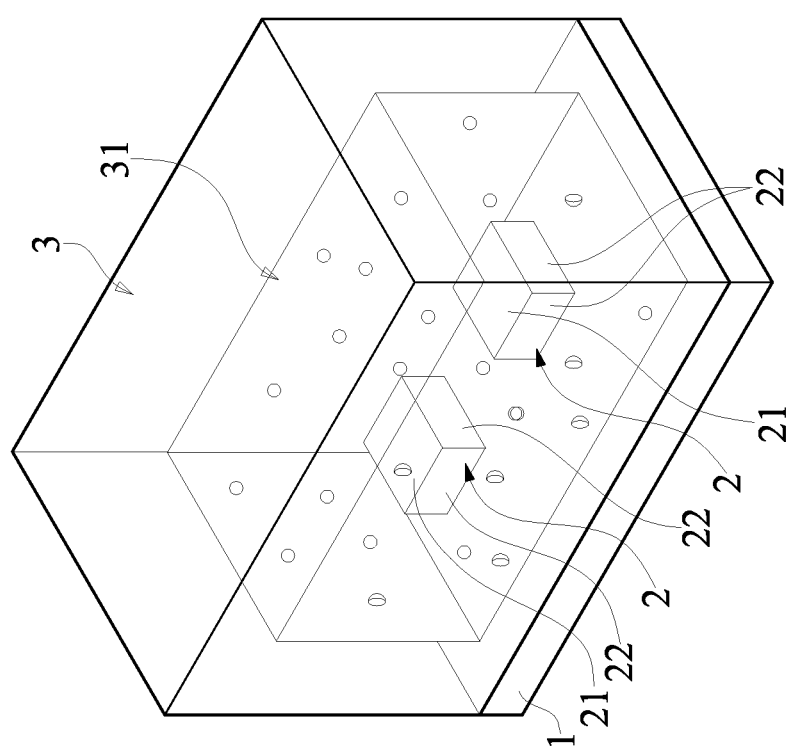
FIG. 16 is a schematic view of the light emitting diode package structure according to another embodiment of the present disclosure.

Referring to FIG. 16, FIG. 16 is a schematic view of the light emitting diode package structure according to another embodiment of the present disclosure. The difference between the present embodiment and the previous embodiment is that the light emitting diode package structure 200 includes two light emitting chips 2. The top light emitting surface 21 and the four side light emitting surfaces 22 of each of the light emitting chips 2 are covered by the transparent package 4. Other structures included by the light emitting diode package structure 200 of the present embodiment are the same as those of the previous embodiment, and will not be reiterated herein.

In contrast, the light emitting diode package structure of the present embodiment can be manufactured by the above-mentioned method for manufacturing the light emitting diode package structure of the present disclosure, and in the removing step S3, each of the color converting packages cover two of the light emitting chips. The detail description of other steps can be referred to in the previous embodiment, and will not be reiterated herein.

The above-mentioned light emitting diode package structure of the present disclosure can be manufactured by the method for manufacturing the light emitting diode package structure of the present disclosure, but the present disclosure is not limited thereto.

BENEFICIAL EFFECTS OF THE EMBODIMENTS

In conclusion, in the light emitting diode package structure and method for manufacturing the same provided by the present disclosure, by the design of the transparent package, the color converting particles exposed from the color converting package do not easily change in property, especially when the light emitting diode package structure is arranged in an ambient environment having high temperature and high humidity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for manufacturing a light emitting diode package structure, comprising:
   a fixing step implemented by separately fixing a plurality of light emitting chips onto a substrate;
   a color converting package structure forming step implemented by forming a color converting package structure on the substrate; wherein each of the light emitting chips has a plurality of light emitting surfaces, and the color converting package structure covers all of the light emitting surfaces of each of the light emitting chips; and wherein the color converting package structure has at least one type of color converting particles mixed therein, and a light beam emitted by each of the light emitting chips is white after being converted through the color converting package structure;

a removing step implemented by removing one portion of the color converting package structure, so that the color converting package structure is cut into a plurality of color converting packages, and each of the color converting packages covers at least one of the light emitting chips; wherein each of the color converting packages has a top surface and four side surfaces, and a plurality of edges of the top surface is connected to the four side surfaces; and wherein each of the side surfaces is a cut surface, and parts of the color converting particles are exposed from at least one of the side surfaces;

a transparent package structure forming step implemented by forming a transparent package structure on the substrate; wherein the transparent package structure is connected to the top surface and each of the side surfaces of each of the color converting packages, and the transparent package structure does not have any color converting particles mixed therein; and a cutting step implemented by cutting the transparent package structure and the substrate to form into a plurality of light emitting diode package structures; wherein each of the light emitting diode package structures includes one portion of the substrate, at least one of the light emitting chips, one of the color converting packages, and one of a plurality of transparent packages formed by one portion of the transparent package structure, each of the transparent packages covers an outer periphery of the one of color converting packages connected thereto, and the color converting particles exposed from any one of the side surfaces are covered by the one of the transparent packages.

2. The method according to claim 1, wherein, in the color converting package structure forming step, a mold is used to form the color converting package structure, and a top surface of the color converting package structure is flat.

3. The method according to claim 1, further comprising a polishing step between the color converting package structure forming step and the removing step; wherein the polishing step is implemented by using a polishing apparatus to polish a top surface of the color converting package structure away from the substrate; wherein, in the transparent package structure forming step, the transparent package structure covers each of the color converting packages, and the color converting particles exposed from a top surface of the corresponding one of the color converting packages are covered by the transparent package structure; and wherein the transparent package of each of the light emitting diode package structures formed after the cutting step covers the top surface and each of the side surfaces of the one of the color converting packages connected to the transparent package.

4. The method according to claim 1, wherein, in the fixing step, the light emitting chips are fixed to the substrate through wire bonding; and wherein a shore A hardness of each of the color converting packages is within a range from 30 degrees to 90 degrees, and a shore D hardness of the transparent packages is within a range from 30 degrees to 90 degrees, and the shore hardness of each of the transparent packages is greater than the shore hardness of any one of the color converting packages.

5. The method according to claim 1, wherein, in the fixing step, the light emitting chips are fixed to the substrate in a flip-chip manner; and wherein the color converting packages are formed by a material that has the plurality of color converting particles mixed therein, a shore D hardness of the material is within a range from 30 degrees to 90 degrees, and the transparent packages are formed by the material that does not have the plurality of color converting particles mixed therein.

6. A light emitting diode package structure, comprising:
a substrate;
at least one light emitting chip fixed to the substrate;
a color converting package disposed on the substrate; wherein the color converting package covers all of a plurality of light emitting surfaces of the at least one light emitting chip, the color converting package has at least one type of color converting particles mixed therein, and a light beam emitted by the at least one light emitting chip is white after being converted through the color converting package; wherein the color converting package has a top surface and four side surfaces, and a plurality of edges of the top surface is connected to the four side surfaces; and wherein each of the side surfaces is a cut surface, and parts of the color converting particles are exposed from at least one of the side surfaces; and
a transparent package disposed on the substrate, wherein the transparent package does not have any color converting particles mixed therein, the transparent package covers an outer periphery of the color converting package, and the color converting particles exposed from any one of the side surfaces are covered by the transparent package.

7. The light emitting diode package structure according to claim 6, wherein the color converting package has at least one polishing mark structure at the top surface thereof, and parts of the color converting particles are exposed from the top surface; wherein the transparent package has a top portion and four side portions, the four side portions are connected to the four side surfaces of the color converting package, the top portion is connected to the top surface of the color converting package, and the color converting particles exposed from the top surface are covered by the top portion; and wherein a thickness of each of the side portions is within a range from 0.05 mm to 0.5 mm, and a thickness of the top portion is within a range from 0.05 mm to 0.5 mm.

8. The light emitting diode package structure according to claim 6, wherein a top surface of the color converting package is a cut surface, and parts of the color converting particles are exposed from the top surface; wherein the transparent package has a top portion and four side portions, the four side portions are connected to the four side surfaces of the color converting package, and the top portion is connected to the top surface of the color converting package, and the color converting particles exposed from the top surface are covered by the top portion; and wherein a thickness of the top portion is within a range from 0.05 mm to 0.5 mm.

9. The light emitting diode package structure according to claim 6, wherein a shore A hardness of the color converting package is within a range from 30 degrees to 90 degrees, a shore D hardness of the transparent package is within a range from 30 degrees to 90 degrees, the shore hardness of the transparent package is greater than the shore hardness of the color converting package, and the at least one light emitting chip is electrically connected to the substrate through a plurality of conducting wires.

10. The light emitting diode package structure according to claim 6, wherein the at least one light emitting chip includes a plurality of pad structures, the substrate includes a plurality of electrical connection structures, the pad structures of the at least one light emitting chip are connected to the electrical connection structures through a solder structure, the color converting package is formed by a material having the plurality of color converting particles mixed in the material, a shore D hardness of the material is within a range from 30 degrees to 90 degrees, and the transparent package is formed by the material that does not have the plurality of color converting particles mixed in the material.

* * * * *